(12) United States Patent
Yoon (10) Patent No.: US 8,531,892 B2
(45) Date of Patent: Sep. 10, 2013

(54) SEMICONDUCTOR MEMORY DEVICE

(75) Inventor: Tae Hun Yoon, Seoul (KR)

(73) Assignee: Hynix Semiconductor Inc., Icheon (KR)

(*) Notice: Subject to any disclaimer, the term of this patent is extended or adjusted under 35 U.S.C. 154(b) by 81 days.

(21) Appl. No.: 13/343,399

(22) Filed: Jan. 4, 2012

(65) Prior Publication Data

US 2012/0170360 A1 Jul. 5, 2012

(30) Foreign Application Priority Data

Jan. 5, 2011 (KR) ........................ 10-2011-0001099

(51) Int. Cl.
*G11C 16/04* (2006.01)
(52) U.S. Cl.
USPC .. 365/189.05; 365/163; 365/148; 365/189.16
(58) Field of Classification Search
USPC ........... 365/189.05, 163, 148, 189.16, 189.09
See application file for complete search history.

(56) References Cited

U.S. PATENT DOCUMENTS

| 7,529,124 B2 | 5/2009 | Cho et al. | |
| 7,688,645 B2 * | 3/2010 | Matsui | ...................... 365/189.05 |

FOREIGN PATENT DOCUMENTS

KR 100764738 B1 10/2007

* cited by examiner

*Primary Examiner* — David Lam (57) ABSTRACT

A semiconductor memory device is disclosed. The semiconductor memory device converts a sequentially-changing step voltage into a current so as to provide a write current, and minimizes the influence of a threshold voltage variation caused by fabrication deviation, such that it can be stably operated. The semiconductor memory device includes a current driver. The current driver includes a step voltage provider configured to provide a step control voltage sequentially changing in response to a pulse control signal, a control current provider configured to provide a control current in response to the step control voltage, and a write driver configured to provide a write current capable of writing data in a memory cell in response to the control current.

17 Claims, 10 Drawing Sheets

SEMICONDUCTOR MEMORY DEVICE

CROSS-REFERENCE TO RELATED APPLICATION

The priority of Korean patent application No. 10-2011-0001099 filed on Jan. 5, 2011, the disclosure of which is hereby incorporated in its entirety by reference, is claimed.

BACKGROUND OF THE INVENTION

Embodiments of the present invention relate to a semiconductor memory device, and more particularly to a semiconductor memory device including a current driver that is capable of providing a linearly-changing drive current by minimizing influence caused by threshold voltage variation of a transistor, which may be generated according to a fabrication process or an operation temperature of the semiconductor memory device.

A current driver provides a current to a plurality of memory cells where data is stored in response to the current, and it may include a plurality of transistors. Threshold voltages of the transistors may change according to a fabrication process and/or temperature variation. The magnitude of a current flowing in one terminal, e.g., a drain, of each transistor may increase in proportion to the square of a threshold voltage.

If the transistor is driven at a specific voltage, a current flowing through the transistor may be changed according to a voltage change. The current change may affect the amplitude or a maintenance time of an output voltage or current of the transistor. Since the magnitude of a write current provided from the current driver is not stabilized by the threshold voltage deviation of transistors in the current driver, data distribution may substantially increase.

The increased data distribution may cause write failure, and thus repeated writing and verification operations are required. As a result, an operation time is unavoidably increased, which reduces the operation reliability.

BRIEF SUMMARY OF THE INVENTION

Various embodiments of the present invention are directed to providing a semiconductor memory device that may substantially obviate one or more problems due to limitations and disadvantages of the related art.

An embodiment of the present invention provides a semiconductor memory device for providing a control current that stably changes on the basis of a sequentially-changing step voltage and storing data in a memory cell on the basis of the control current.

In accordance with an aspect of the present invention, a semiconductor memory device includes a memory cell array and a current driver. The memory cell array includes a plurality of memory cells. The current driver includes a step voltage provider, a control current provider and a write driver. The current driver provides a write current to the memory cell array. The step voltage provider provides a step control voltage whose voltage levels changes in response to a pulse control signal. The control current provider configured to provide a control current in response to the step control voltage. The write driver provides the write current to write data in the memory cell array in response to the control current.

The control current provider may include a plurality of transistors, and the step control voltage is converted to the control current on the basis of size ratios of the plurality of transistors.

The control current provider may include a unity gain buffer, a plurality of transistors. The unity gain buffer provides a step current by stabilizing the step control voltage. The plurality of transistors provides the control current on the basis of the step current, wherein the control current has a different value depending on size ratios of the plurality of transistors.

The unity gain buffer may include an inverting terminal receiving the step control voltage and a non-inverting terminal coupled to a first node. The plurality of transistors may include a first PMOS transistor including a gate terminal coupled to an output terminal of the unity gain buffer, a first terminal coupled to a power-supply voltage, and a second terminal coupled to the first node, a second PMOS transistor including a gate terminal coupled to the gate terminal of the first PMOS transistor and a first terminal receiving the power-supply voltage, a first NMOS transistor including a gate terminal and a first terminal coupled to a second terminal of the second PMOS transistor and a second terminal coupled to a ground voltage, and a second NMOS transistor including a gate terminal coupled to the gate terminal of the first NMOS transistor, a second terminal coupled to the ground voltage, and a first terminal through which the control current is output. The second NMOS transistor is coupled to the first NMOS transistor in the form of a current mirror.

The semiconductor memory device may further include a resistor coupled between the first node and the ground voltage.

The write driver includes a first PMOS transistor and a second transistor. The first PMOS transistor includes a second terminal receiving a write step-up voltage and a gate terminal and a first terminal commonly coupled to each other to receive the control current. The second PMOS transistor includes a gate terminal coupled to the gate terminal of the first PMOS transistor, a second terminal receiving the write step-up voltage, and a first terminal to provide the write current.

The step voltage provider may include a maximum voltage selector, a minimum voltage selector and a step voltage selector. The maximum voltage selector selects and outputs a maximum voltage of the step control voltage on the basis of the pulse control signal. The minimum voltage selector selects and outputs a minimum voltage of the step control voltage on the basis of the pulse control signal. The step voltage selector provides the step control voltage whose voltage level sequentially changes between the maximum voltage and the minimum voltage on the basis of the pulse control signal.

The step voltage provider may further include a temperature sensing unit. The temperature sensing unit provides a temperature sensing signal by sensing an operation temperature of the semiconductor memory device Voltage levels of the maximum voltage and the minimum voltage varies in response to the temperature sensing signal.

The maximum voltage selector may include a plurality of first resistors coupled in series between a first voltage and a ground voltage, and the maximum voltage selector outputs the maximum voltage by dividing the first voltage using the first resistors.

The minimum voltage selector includes a plurality of second resistors coupled in series between a second voltage and a ground voltage, and the minimum voltage selector outputs the minimum voltage by dividing the second voltage using the second resistors.

The step voltage selector includes a plurality of third resistors coupled in series between the maximum voltage and the minimum voltage. The step voltage selector outputs the step control voltage whose voltage level sequentially changes in a range of the maximum voltage to the minimum voltage.

The semiconductor memory device may further include a temperature sensing unit configured to control the first and second voltages by sensing an operation temperature of the semiconductor memory device.

The memory cell array according to some example embodiments includes a plurality of phase change memory cells having different resistance values depending on the write current.

The semiconductor memory device may further include a controller configured to provide an address signal to the memory cell array, and provide the pulse control signal.

The pulse control signal includes a maximum voltage control signal, a minimum voltage control signal, and a step voltage control signal. The maximum voltage selector, the minimum voltage selector, and the step voltage selector are controlled by the maximum voltage control signal, the minimum voltage control signal, and the step voltage control signal, respectively.

Each of the maximum voltage control signal, the minimum voltage control signal, and the step voltage control signal is a digital signal including a plurality of bits.

One of the bits of the maximum voltage control signal is activated to select and output one of voltage levels generated by the maximum voltage selector as the maximum voltage. One of the bits of the minimum voltage control signal is activated to select and output one of voltage levels generated by the minimum voltage selector as the minimum voltage. The bits of the step voltage control signal are sequentially activated to output the step control voltage.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1:
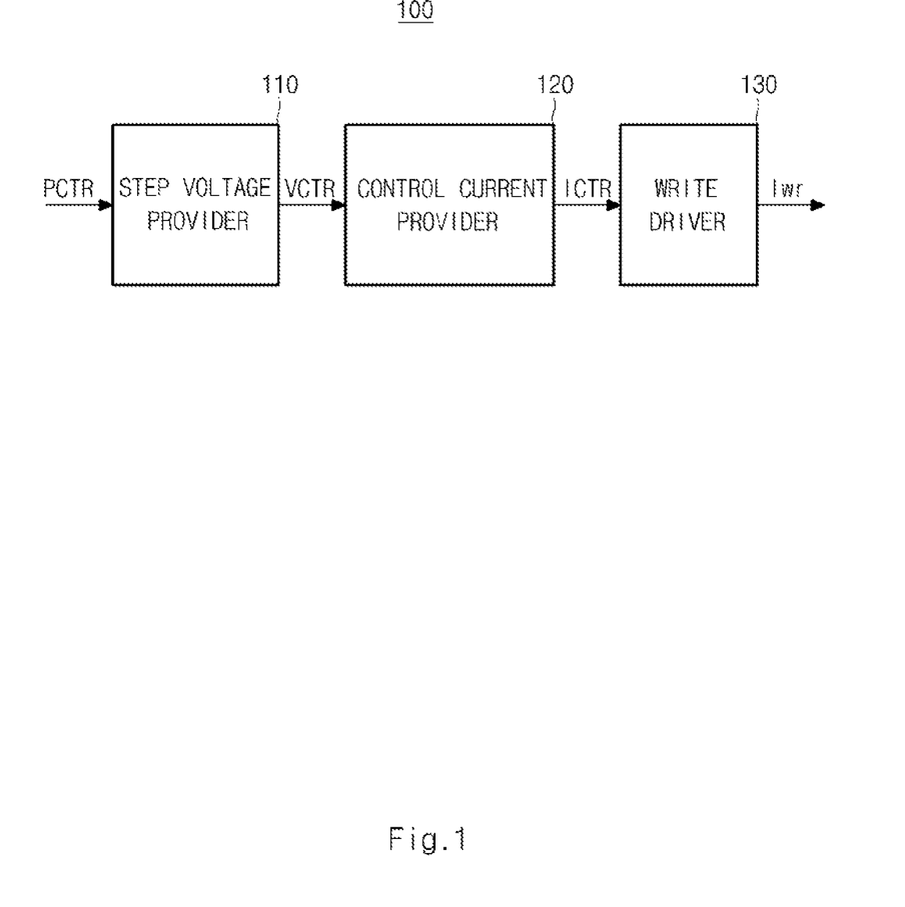
FIG. 1 illustrates a block diagram of a current driver according to an embodiment of the present invention.

FIG. 1 illustrates a block diagram of a current driver according to an embodiment of the present invention.

Referring to FIG. 1, the current driver 100 includes a step voltage provider 110, a control current provider 120, and a write driver 130.

The step voltage provider 110 provides a step control voltage VCTR that sequentially changes in response to a pulse control signal PCTR. The pulse control signal PCTR may be provided from an external device such as a host, or may be generated from a controller (not shown) contained in a semiconductor memory device including the current driver 100.

In accordance with an embodiment, the pulse control signal PCTR may provide a sequentially-reducing step control voltage VCTR. The pulse control signal PCTR establishes a maximum voltage and a minimum voltage of the step control voltage VCTR so as to establish a variation range of the step control voltage VCTR, and determines the number of steps within the variation change so as to control a slope of change of the step control voltage VCTR.

The control current provider 120 provides a control current ICTR on the basis of the step control voltage VCTR. If the step control voltage VCTR controls the write driver 130 for directly providing a write current Iwr, a variation may occur in the threshold voltages of transistors in the write driver 130 due to the step control voltage VCTR since there is a transistor deviation in the transistors contained in the write driver 130, which was generated during a fabrication process of the semiconductor memory device. Accordingly, the write current Iwr may change as much as the square of a difference between the step control voltage VCTR and the threshold voltage.

Therefore, the current driver 100 according to an embodiment of the present invention provides the step control voltage VCTR as the control current ICTR to the write driver 130, such that the write current Iwr does not change in response to the variation of the threshold voltage that may be generated in the fabrication process, and is stably provided.

The write driver 130 provides the write current Iwr used for writing data in a memory cell on the basis of the control current ICTR. In accordance with an embodiment of the present invention, the write driver 130 may include a current mirror. The write driver 130 is coupled to a global bit line GBL of memory cells, and provides the write current Iwr to the global bit line GBL in response to a write command signal during a program operation.

Figure 2:
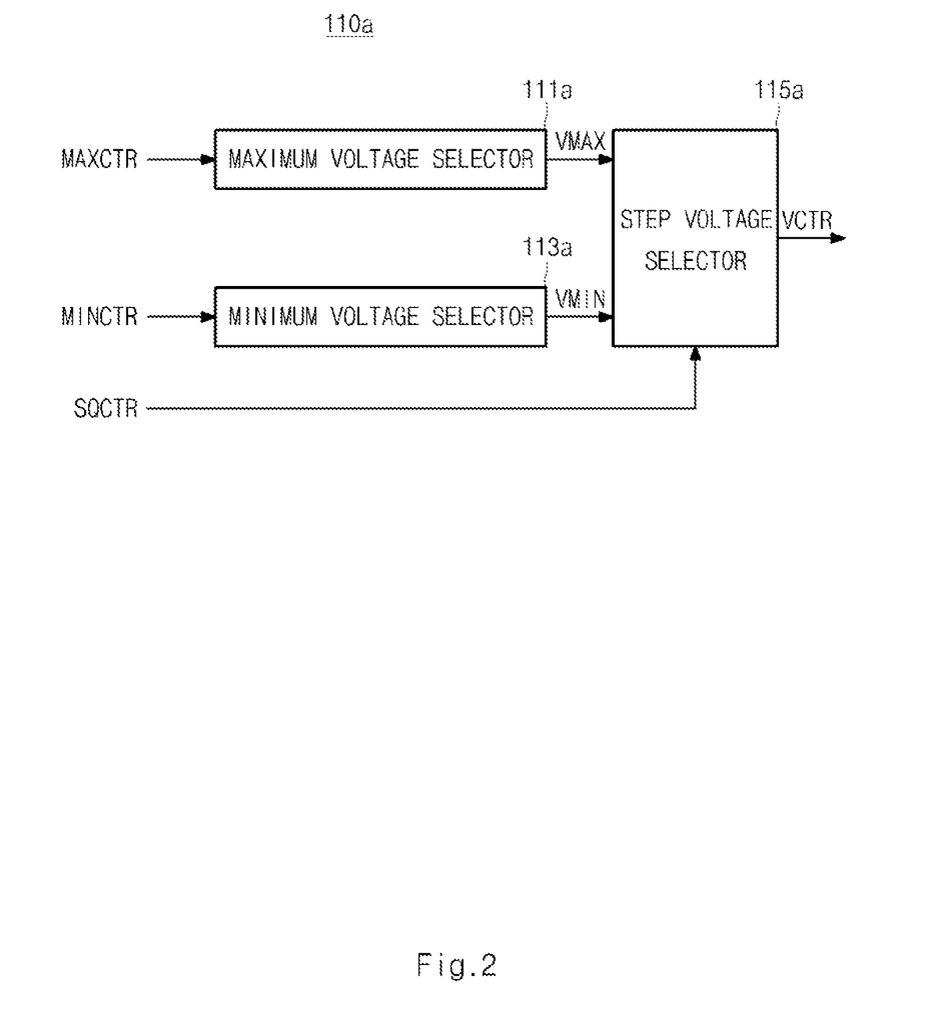
FIGS. 2 and 3 illustrate block diagrams of a step voltage provider shown in FIG. 1 according to embodiments of the present invention.

FIG. 2 illustrates a block diagram of the step voltage provider shown in FIG. 1 according to an embodiment of the present invention.

Referring to FIG. 2, the step voltage provider 110a includes a maximum voltage selector 111a, a minimum voltage selector 113a, and a step voltage selector 115a.

The maximum voltage selector 111a selects and provides a maximum voltage VMAX on the basis of a maximum voltage control signal MAXCTR contained in the pulse control signal PCTR.

The maximum voltage selector 111a may be driven on the basis of a sense step-up voltage VPPSA. Therefore, the maximum voltage VMAX may have a voltage level between the sense step-up voltage VPPSA and a ground voltage GND.

The minimum voltage selector 113a selects and provides a minimum voltage VMIN on the basis of a minimum voltage control signal MINCTR contained in the pulse control signal PCTR. The minimum voltage selector 113a may be driven on the basis of the sense step-up voltage VPPSA or may be driven on the basis of a voltage lower than the sense step-up voltage VPPSA.

The step voltage selector 115a provides the step control voltage VCTR that sequentially changes within a range between the maximum voltage VMAX and the minimum voltage VMIN. The step control voltage VCTR may be selected and provided on the basis of a step voltage control signal SQCTR contained in the pulse control signal PCTR. For example, the step voltage control signal SQCTR controls the number of steps between the maximum voltage VMAX and the minimum voltage VMIN within a predetermined time interval. The predetermined time interval may be substantially the same as a time during which the write current Iwr is generated.

Therefore, the step voltage provider 110a may provide the step control voltage VCTR that sequentially changes within a predetermined voltage range on the basis of the pulse control signal PCTR.

Figure 3:
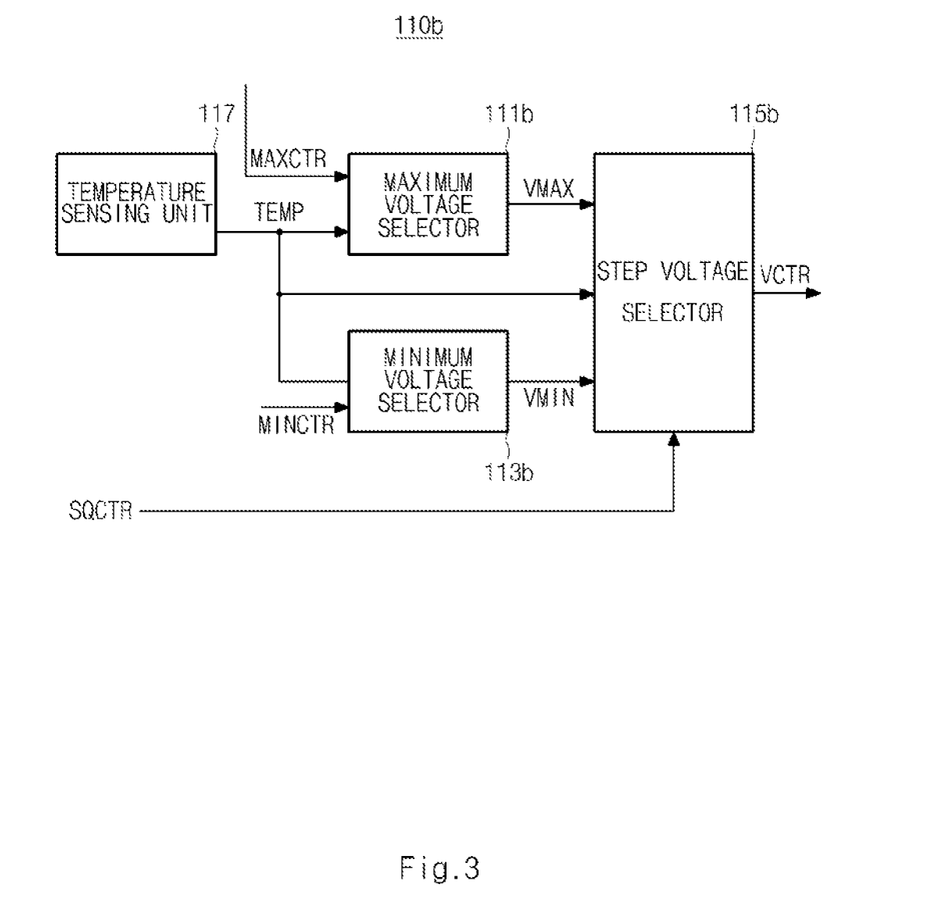

FIG. 3 illustrates a block diagram of the step voltage provider shown in FIG. 1 according to another embodiment of the present invention.

Referring to FIG. 3, the step voltage provider 110b includes a maximum voltage selector 111b, a minimum voltage selector 113b, a step voltage selector 115b, and a temperature sensing unit 117.

Compared to the step voltage provider 110a shown in FIG. 2, the step voltage provider 110b further includes the temperature sensing unit 117.

The temperature sensing unit 117 detects an operation temperature of the semiconductor memory device including the current driver 100 and thus generates a temperature sensing signal TEMP. The temperature sensing signal TEMP may include information regarding the sensed operation temperature. In accordance with an embodiment of the present invention, a maximum voltage VMAX, a minimum voltage VMIN, and a step control voltage VCTR can be compensated on the basis of the temperature sensing signal TEMP and at least one of a maximum voltage control signal MAXCTR, a minimum voltage control signal MINCTR, and a step voltage control signal SQCTR.

In accordance with an embodiment of the present invention, a voltage level for driving the maximum voltage selector 111b and the minimum voltage selector 113b may be adjusted on the basis of the temperature sensing signal TEMP.

The maximum voltage selector 111b selects and provides the maximum voltage VMAX on the basis of the maximum voltage control signal MAXCTR and the temperature sensing signal TEMP. In addition, the maximum voltage selector 111b provides the maximum voltage VMAX on the basis of the driving voltage compensated on the basis of the temperature sensing signal TEMP.

The minimum voltage selector 113b selects and provides the minimum voltage VMIN on the basis of the minimum voltage control signal MINCTR and the temperature sensing signal TEMP. In addition, the minimum voltage selector 113b provides the minimum voltage VMIN on the basis of the driving voltage compensated on the basis of the temperature sensing signal TEMP.

The step voltage selector 115b provides the step control voltage VCTR that sequentially changes between the maximum voltage VMAX and the minimum voltage VMIN that have been temperature-compensated on the basis of the temperature sensing signal TEMP. In accordance with an embodiment of the present invention, the number of steps of the step control voltage VCTR may be different from the number of steps of the step voltage control signal SQCTR since it is compensated on the basis of the temperature sensing signal TEMP.

Figure 4:
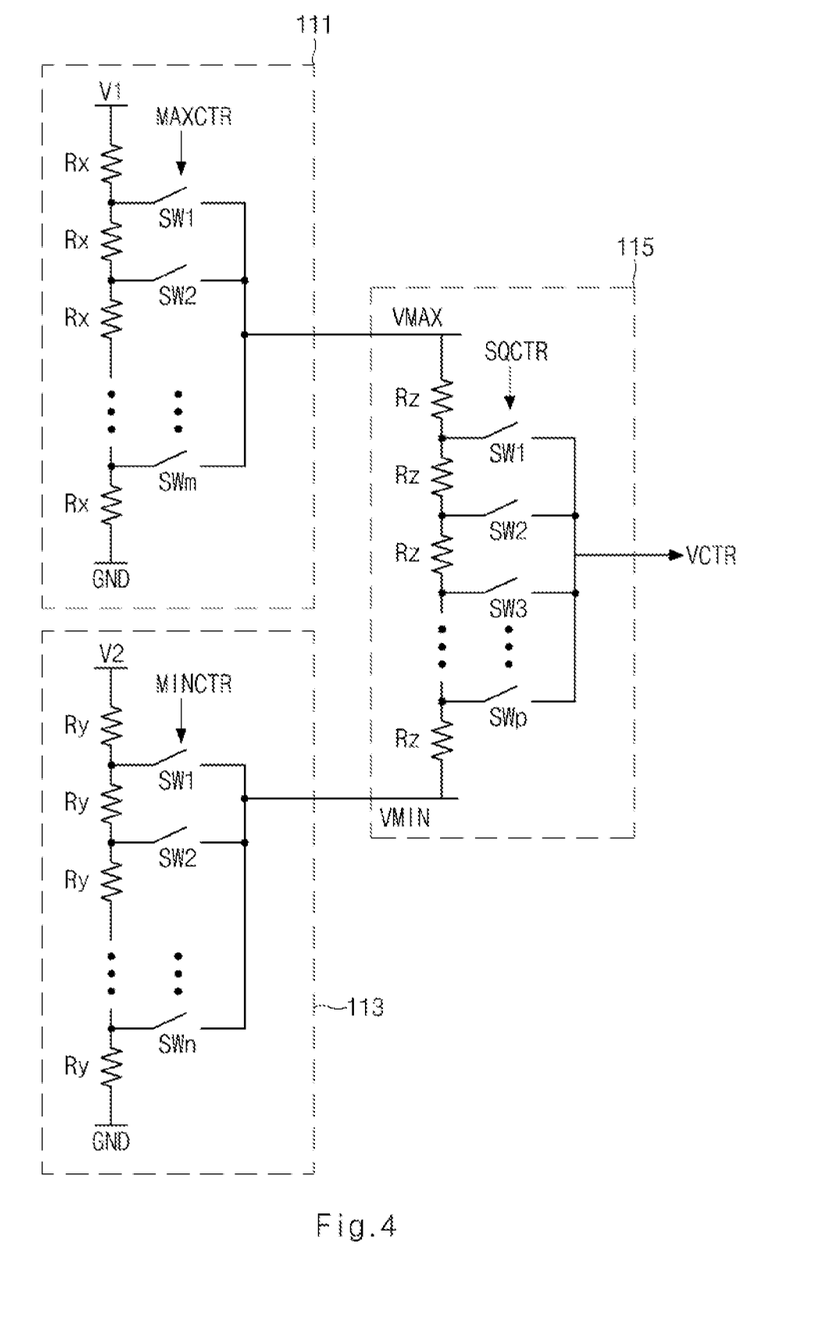
FIG. 4 illustrates a circuit diagram of a maximum voltage selector, a minimum voltage selector, and a step voltage selector according to an embodiment of the present invention.

FIG. 4 illustrates a circuit diagram of a maximum voltage selector, a minimum voltage selector, and a step voltage selector according to an embodiment of the present invention.

The maximum voltage selector 111b, the minimum voltage selector 113b, and the step voltage selector 115b shown in FIG. 3 may respectively include the maximum voltage selector 111, the minimum voltage selector 113, and the step voltage selector 115 shown in FIG. 4.

The maximum voltage selector 111 includes a plurality of first resistors Rx and a plurality of switches SW1 to SWm, m being a positive integer. The first resistors Rx is coupled in series and disposed between a first voltage V1 and a ground voltage GND, and each of the switches SW1 to SWm includes a first terminal coupled to a connection node between two of the first resistors Rx and a second terminal coupled to the step voltage selector 115. The switches SW1 to SWm are turned on in response to the maximum voltage control signal MAXCTR. In accordance with an embodiment of the present invention, the maximum voltage control signal MAXCTR may be a digital signal including as many bits as the number of the switches SW1 to SWm, and only one bit of the maximum voltage control signal MAXCTR may be activated to turn on one of the corresponding switches SW1 to SWm one at a time.

The maximum voltage selector 111 divides the first voltage V1 to supply the maximum voltage VMAX. In accordance with an embodiment of the present invention, the maximum voltage control signal MAXCTR has a value compensated on the basis of the temperature sensing signal TEMP. In accordance with another embodiment, the first voltage V1 may change depending on the temperature sensing signal TEMP.

The first resistors Rx contained in the maximum voltage selector 111 may have the same or different resistance values.

The minimum voltage selector 113 includes a plurality of second resistors Ry coupled in series and disposed between a second voltage V2 and the ground voltage GND and a plurality of switches SW1 to SWn each of which includes a first terminal coupled to a connection node between two of the second resistors Ry and a second terminal coupled to the step voltage selector 115, n being a positive integer. The second resistors Ry may have the same or different resistance values. The switches SW1 to SWn are turned on in response to the minimum voltage control signal MINCTR. The minimum voltage control signal MINCTR may be a digital signal including as many bits as the number of the switches SW1 to SWn. One bit contained in the minimum voltage control signal MINCTR is in a logic high state at a time to turn on a corresponding switch.

Therefore, the minimum voltage selector 113 divides the second voltage V2, turns on one switch in response to the minimum voltage control signal MINCTR, and provides the selected minimum voltage VMIN to the step voltage selector 115.

In accordance with an embodiment of the present invention, the minimum voltage selector 113 may provide the minimum voltage VMIN on the basis of the minimum voltage control signal MINCTR and the temperature sensing signal TEMP. In accordance with an embodiment, the minimum voltage control signal MINCTR may be compensated in different ways according to the temperature sensing signal TEMP, and the second voltage V2 may be adjusted to have a different level in response to the temperature sensing signal TEMP.

In response to the maximum voltage VMAX from the maximum voltage selector 111 and the minimum voltage VMIN from the minimum voltage selector 113, the step voltage selector 115 provides the step control voltage VCTR that sequentially changes between the maximum voltage VMAX and the minimum voltage VMIN. The step control voltage VCTR is controlled by the step voltage control signal SQCTR.

The step voltage control signal SQCTR may sequentially turn on a plurality of switches SW1 to SWp coupled to a plurality of third resistors Rz, p being a positive integer. Therefore, the step control voltage VCTR sequentially changes in a range from the maximum voltage VMAX to the minimum voltage VMIN.

Figure 5:
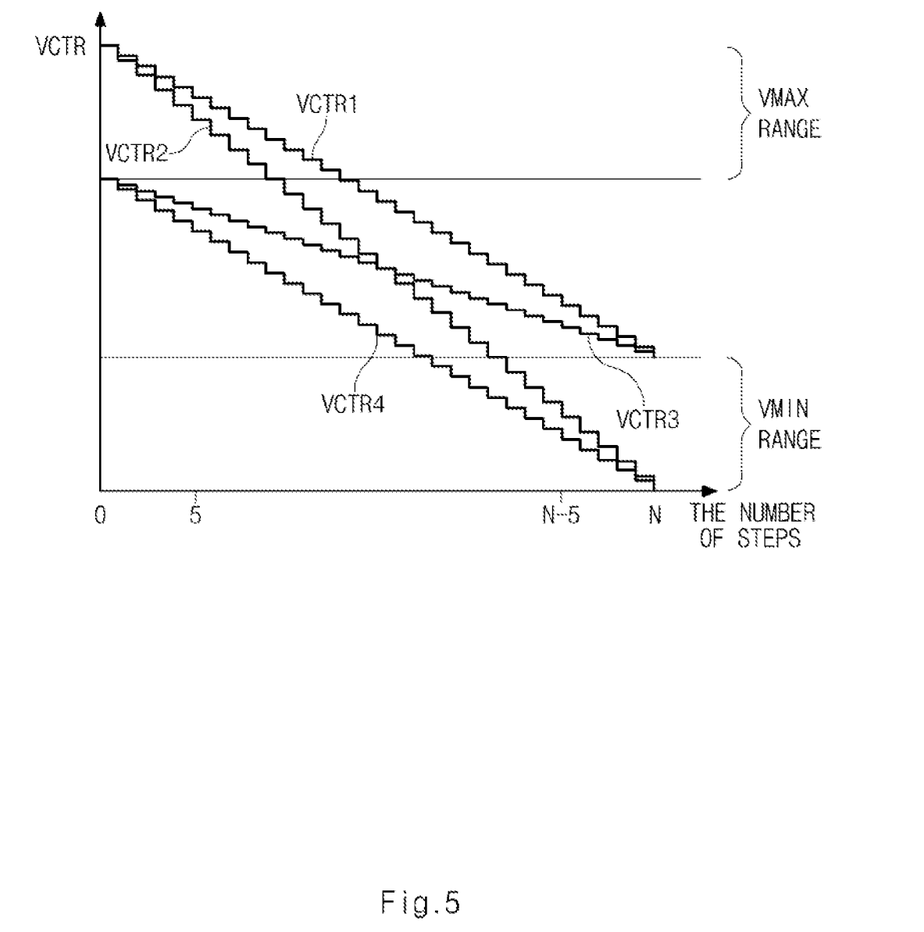
FIG. 5 illustrates a step control voltage (VCTR) according to an embodiment of the present invention.

FIG. 5 illustrates a step control voltage VCTR according to an embodiment of the present invention.

Referring to FIG. 5, the step control voltage VCTR may be provided along not only a range of the maximum voltage VMAX selected by the maximum voltage selector 111 but also a range of the minimum voltage VMIN selected by the minimum voltage selector 113.

FIG. 5 shows the step control voltage VCTR, e.g., VCTR 1 to VCTR4, on the condition that the maximum voltage VMAX and the minimum voltage VMIN are set to different voltage levels within the range of the maximum voltage VMAX and the range of the minimum voltage VMIN.

The first step control voltage VCTR1 is set by the highest voltage level in the range of the maximum voltage VMAX and the highest voltage level in the range of the minimum voltage VMIN. For example, the first step control voltage VCTR1 may be generated when the first switch SW1 of the maximum voltage selector 111 in FIG. 4 is turned on and the first switch SW1 of the minimum voltage selector 113 in FIG. 4 is turned on.

The second step control voltage VCTR2 is set by the highest voltage level in the range of maximum voltage VMAX and the lowest voltage level in the range of minimum voltage VMIN. For example, the second step control voltage VCTR2 may be generated when the first switch SW1 of the maximum voltage selector 111 in FIG. 4 is turned on and the n-th switch SWn of the minimum voltage selector 113 in FIG. 4 is turned on.

The third step control voltage VCTR3 is set by the lowest voltage level in the range of maximum voltage VMAX and the highest voltage level in the range of minimum voltage VMIN. For example, the third step control voltage VCTR3 may be generated when the m-th switch SWm of the maximum voltage selector 111 in FIG. 4 is turned on and the first switch SW1 of the minimum voltage selector 113 in FIG. 4 is turned on.

The fourth step control voltage VCTR4 is set by the lowest voltage level in the range of maximum voltage VMAX and the lowest voltage level in the range of minimum voltage VMIN. For example, the fourth step control voltage VCTR4 may be generated when the m-th switch SWm of the maximum voltage selector 111 in FIG. 4 is turned on and the n-th switch SWn of the minimum voltage selector 113 in FIG. 4 is turned on.

Therefore, according to a method for establishing the maximum voltage VMAX and the minimum voltage VMIN, various step control voltages VCTR1 to VCTR4 may be generated irrespective of the step voltage control signal SQCTR.

Figure 6:
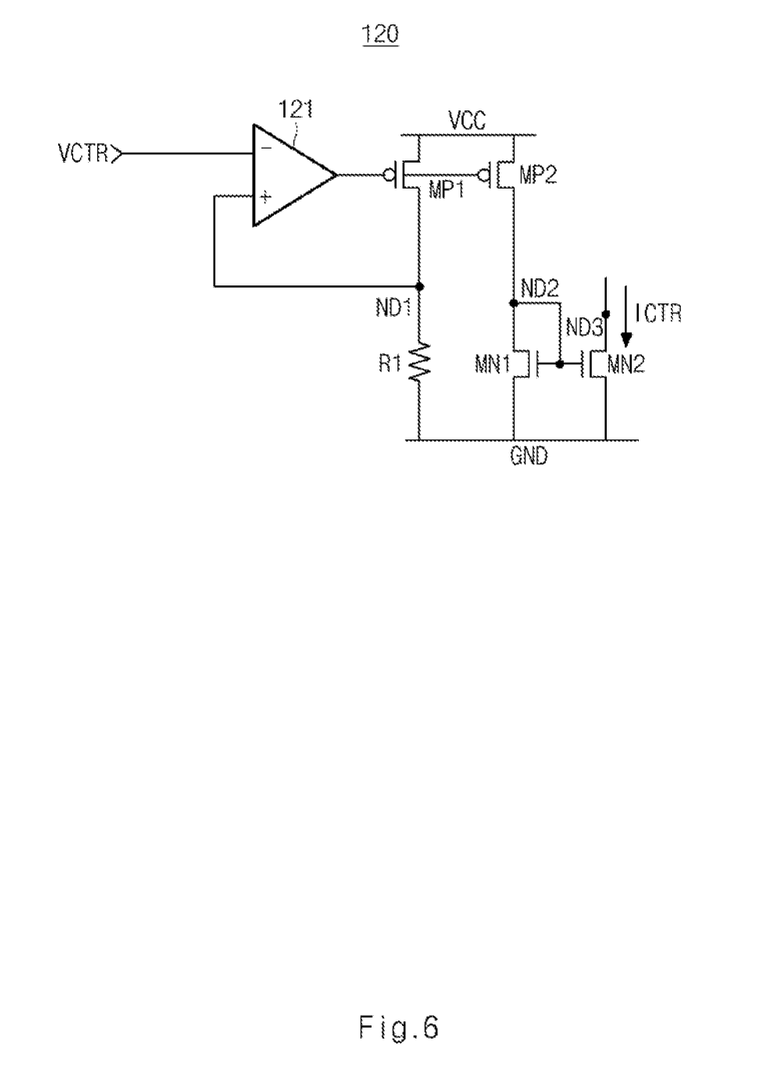
FIG. 6 illustrates a circuit diagram of a control current provider shown in FIG. 1 according to an embodiment of the present invention.

FIG. 6 illustrates a circuit diagram of the control current provider 120 shown in FIG. 1 according to an embodiment of the present invention.

Referring to FIG. 6, the control current provider 120 includes a unity gain buffer 121, first and second PMOS transistors MP1 and MP2, a resistor R1, and first and second NMOS transistors MN1 and MN2.

The control current provider 120 converts the step control voltage VCTR into a step current. In response to the step current, the transistors MP1, MP2, MN1, and MN2 output the control current ICTR on the basis of sizes thereof, i.e., the channel lengths and width ratios of the transistors MP1, MP2, MN1, and MN2.

The unity gain buffer 121 includes an inverting terminal receiving the step control voltage VCTR and a non-inverting terminal coupled to a first node ND1. The unity gain buffer 121 stabilizes the step control voltage VCTR and provides the stabilized voltage to the first node ND1.

An output terminal of the unity gain buffer 121 is coupled to a gate terminal of the first PMOS transistor MP1. Accordingly, if a voltage level on the first node ND1 is lower than that of the step control voltage VCTR, the first PMOS transistor MP1 is turned on and thus provides a power-supply voltage VCC to the first node ND1, such that the voltage level on the first node ND1 increases. If the voltage level on the first node ND1 is greater than or equal to that of the step control voltage VCTR, the first PMOS transistor MP1 is turned off. Therefore, the voltage level on the first node ND1 may be substantially the same as that of the step control voltage VCTR.

The first PMOS transistor MP1 includes a first terminal coupled to the first node ND1 and a second terminal receiving the power-supply voltage VCC. The resistor R1 is coupled to and disposed between the first node ND1 and the ground voltage GND. If the voltage level on the first node ND1 is substantially the same as that of the step control voltage VCTR, a current flowing from the first node ND1 through the resistor R1 corresponds to a resultant value obtained when the step control voltage VCTR is divided by the resistor R1 according to Ohm's law, such that the current flowing through the first node ND1 is proportional to the step control voltage VCTR. In this embodiment, the current flowing through the first node ND1 is referred to as the step current.

The second PMOS transistor MP2 includes a gate terminal coupled to the output terminal of the unity gain buffer 121, and a second terminal coupled to the power-supply voltage VCC. The gate terminal of the second PMOS transistor MP2 and the gate terminal of the first PMOS transistor MP1 are commonly coupled to the output terminal of the unity gain buffer 121.

The first NMOS transistor MN1 includes a first terminal and a gate terminal coupled to a first terminal of the second PMOS transistor MP2, and also includes a second terminal coupled to the ground voltage GND. The second NMOS transistor MN2 includes a gate terminal coupled to the gate terminal of the first NMOS transistor MN1 and a second terminal coupled to the ground voltage GND, such that it is coupled to the first NMOS transistor MN1 in the form of a current mirror.

The second NMOS transistor MN2 provides the control current ICTR through a first terminal. The control current ICTR is determined based on the step current, a width ratio of the first PMOS transistor MP1 and the second PMOS transistor MP2, and a width ratio of the first NMOS transistor MN1 and the second NMOS transistor MN2.

Therefore, the semiconductor memory device according to the embodiment of the present invention can provide the control current ICTR that is not affected by a threshold voltage of a transistor changing according to a fabrication process and/or temperature variation and corresponds to the step control voltage VCTR.

Figure 7:
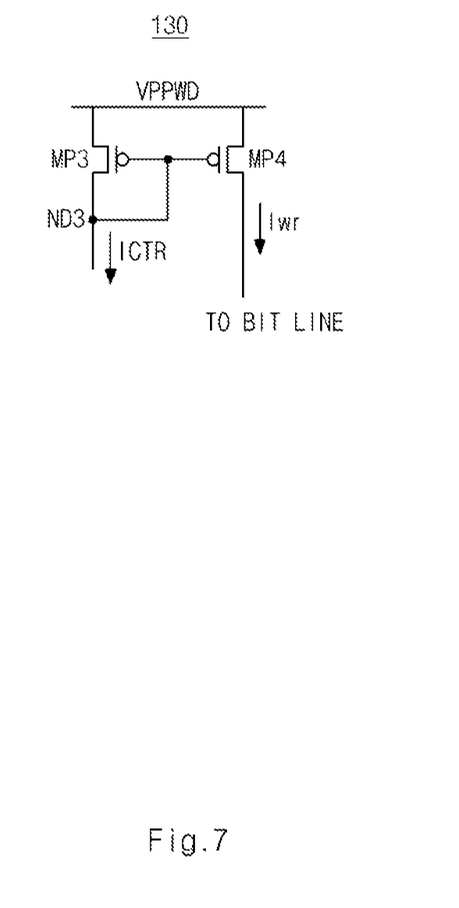
FIG. 7 illustrates a circuit diagram of a write driver shown in FIG. 1 according to an embodiment of the present invention.

FIG. 7 illustrates a circuit diagram of the write driver 130 shown in FIG. 1 according to an embodiment of the present invention.

Referring to FIG. 7, the write driver 130 includes third and fourth PMOS transistors MP3 and MP4.

The third PMOS transistor MP3 includes a first terminal receiving the control current ICTR, a gate terminal coupled to the first terminal, and a second terminal receiving a write step-up voltage VPPWD. The connection node of the gate terminal and the first terminal of the third PMOS transistor MP3 is a node ND3.

The fourth PMOS transistor MP4 includes a gate terminal coupled to the gate terminal of the third PMOS transistor MP3, i.e., the node ND3, and provides the write current Iwr through a first terminal.

The third and fourth PMOS transistors MP3 and MP4 receive the control current ICTR from the control current provider 120 and outputs the write current Iwr. The magnitude of the write current Iwr may change according to a width ratio of the third and fourth PMOS transistors MP3 and MP4.

Figure 8:
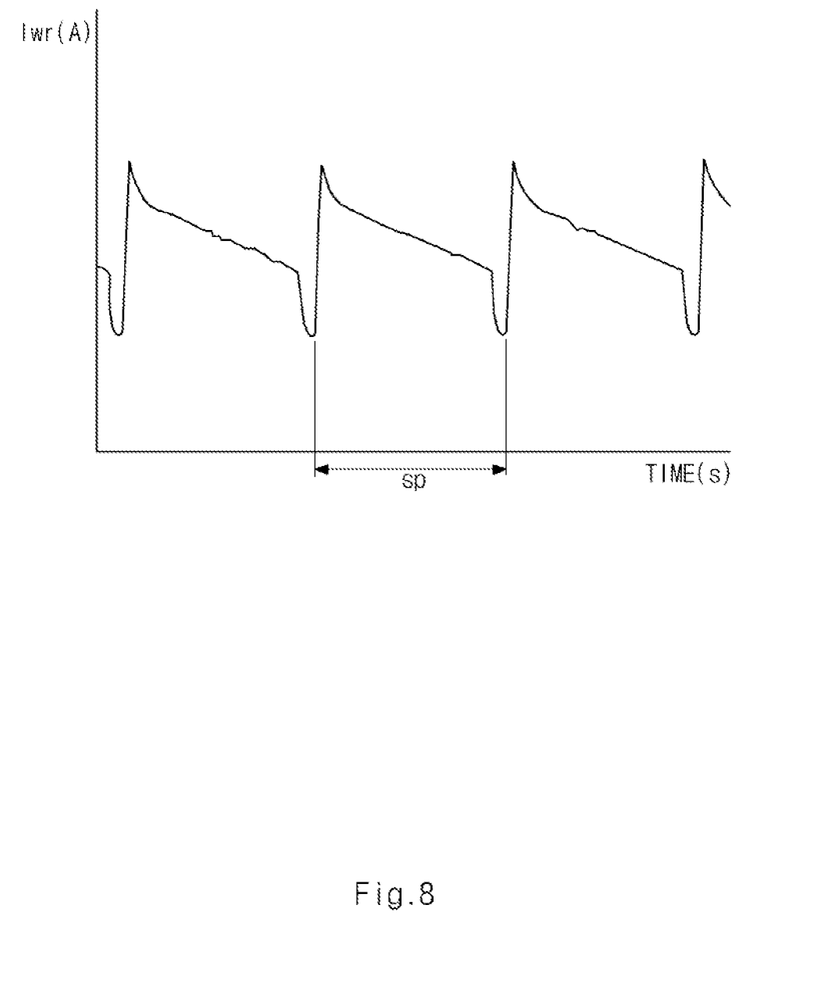
FIG. 8 shows a write current generated in a semiconductor memory device according to an embodiment of the present invention.

FIG. 8 shows a write current Iwr generated in a semiconductor memory device according to an embodiment of the present invention.

As can be seen from FIG. 8, the write current Iwr has a waveform substantially the same as that of the step control voltage VCTR of FIG. 5, but only the magnitude thereof changes. The write current Iwr is reduced from a maximum value to a minimum value during a predetermined time sp.

Data is written in a memory cell coupled to a bit line on the basis of the write current Iwr. An operation for writing the data in the memory cell will hereinafter be described in detail.

Figure 9:
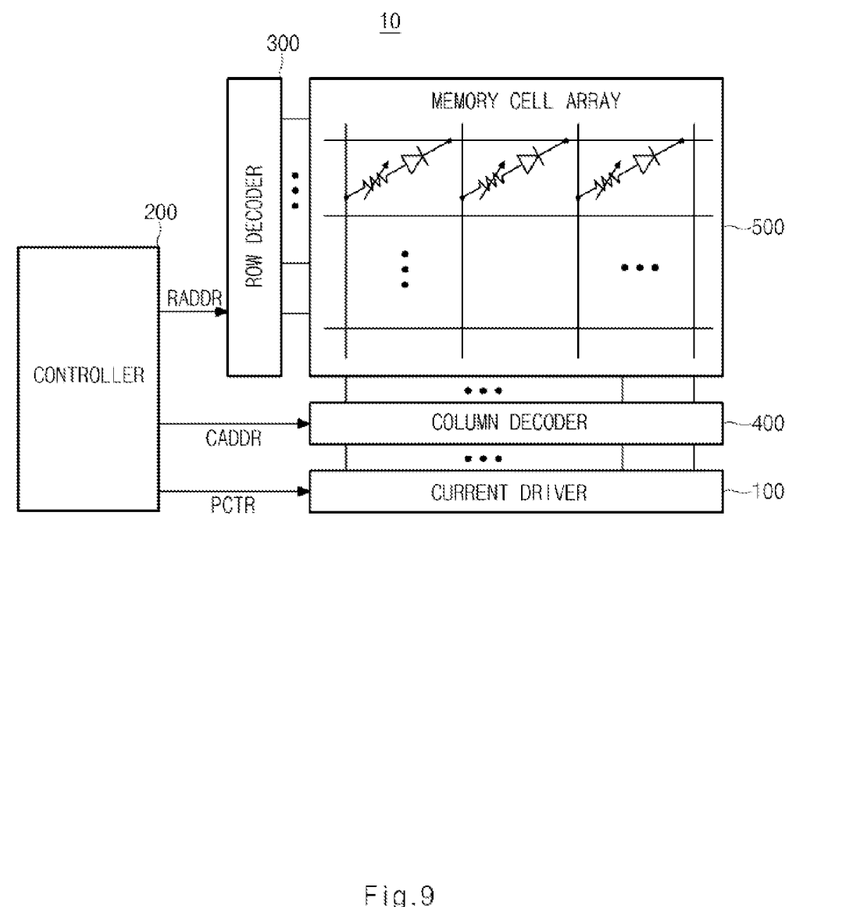
FIG. 9 illustrates a block diagram of a semiconductor memory device according to an embodiment of the present invention.

FIG. 9 illustrates a block diagram of a semiconductor memory device according to an embodiment of the present invention.

Referring to FIG. 9, the semiconductor memory device includes a controller 200, a row decoder 300, a column decoder 400, a memory cell array 500, and a current driver 100.

The controller 200 communicates with an external device such as a host, such that it can generate a row address signal RADDR, a column address signal CADDR, and a pulse control signal PCTR. A specific memory cell of the memory cell array 500 may be designated on the basis of the row address signal RADDR and the column address signal CADDR. The current driver 100 generates a write current Iwr on the basis of the pulse control signal PCTR and provides the write current Iwr to the memory cell array 500.

The row decoder 300 provides a program voltage and a pass voltage to the memory cell array 500 on the basis of the row address signal RADDR. The row decoder 300 is coupled to each word line of the memory cell array 500.

The column decoder 400 provides the write current Iwr or a read current Iread to the memory cell array 500 on the basis of the column address signal CADDR. The column decoder 400 may include a local column decoder and a global column decoder, and is coupled to each bit line of the memory cell array 500.

The memory cell array 500 may include a plurality of memory cells driven in response to a current. Each memory cell is coupled to a word line and a bit line, such that it can store data therein. In accordance with an embodiment of the present invention, the memory cell array 500 may include a plurality of phase change memory cells. The phase change memory cell includes a phase change material, and has different states depending on a current applied to both ends thereof, thereby storing data therein depending on resistance values obtained on the basis of such different states.

The current driver 100 generates the write current Iwr provided to the plurality of memory cells contained in the memory cell array 500 on the basis of the pulse control signal PCTR. The current driver 100 shown in FIG. 9 may include the circuits shown in FIGS. 1 to 4, 6, and 7.

The current driver 100 generates the step control voltage VCTR that sequentially changes between the maximum voltage VMAX and the minimum voltage VMIN on the basis of the pulse control signal PCTR. Upon receiving the step control voltage VCTR, the current driver 100 provides the control current ICTR determined on the basis of width ratios of respective transistors therein irrespective of threshold voltages of the transistors. Subsequently, the write current Iwr is generated on the basis of the control current ICTR, such that it is possible to provide the write current Iwr for a predetermined time within a predetermined region.

Therefore, the semiconductor memory device according to the embodiments of the present invention controls the write driver using the control current ICTR stably provided on the basis of the pulse control signal PCTR, such that it can provide the write current Iwr that maintains its current value for a predetermined write time. As a result, the number of write errors can be minimized, which improves the operation reliability.

Figure 10A:
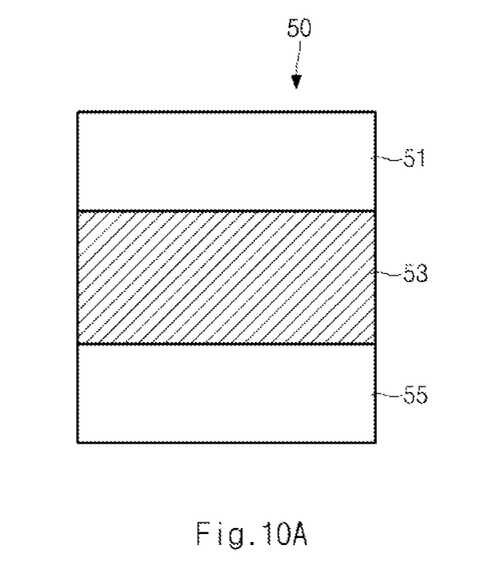
FIG. 10A shows a phase change element contained in a memory cell array according to an embodiment of the present invention.

FIG. 10A shows a phase change element contained in a memory cell array according to an embodiment of the present invention.

Referring to FIG. 10A, the phase change element 50 includes a phase change material 53 inserted between a top electrode 51 and a bottom electrode 55. If a predetermined voltage is applied between the top electrode 51 and the bottom electrode 55, a current flows in the phase change material 53, and a temperature of the phase change material 53 changes, so that an electrical conductivity status of the phase change material 53 also changes.

Figure 10B:
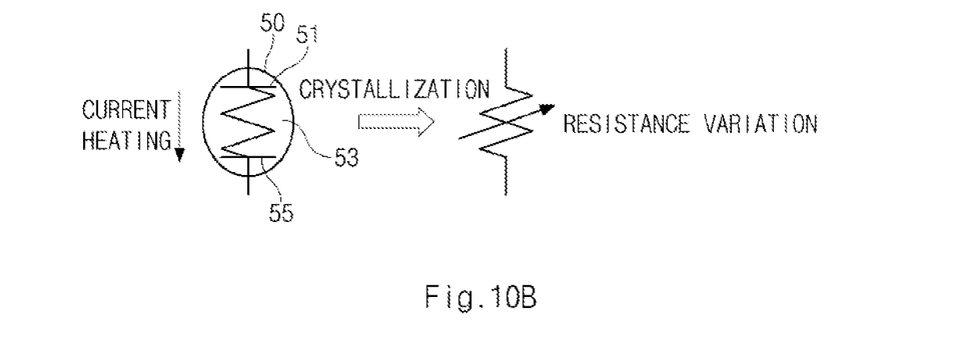
FIG. 10B illustrates a state change of a phase change element according to an embodiment of the present invention.

FIG. 10B illustrates a state change of the phase change element 50 according to an embodiment of the present invention.

Referring to FIG. 10B, if the phase change material 53 is heated by a current flowing between the top electrode 51 and the bottom electrode 55 of the phase change element 50, the phase change material 53 is crystallized so that resistance thereof changes. Therefore, the phase change element 50 may generally be denoted by a variable resistor.

For example, if a low current equal to or less than a threshold value flows in the phase change element 50, the phase change material 53 is crystallized, such that the phase change element 50 has a low resistance value. As a result, a current may flow between the top electrode 51 and the bottom electrode 55.

On the other hand, if a high current greater than the threshold value flows in the phase change element 50, the phase change material 53 has a temperature higher than a melting point. The phase change material 53 changes to an amorphous phase that is a high-resistance phase. As a result, it is difficult for a current to flow between the top electrode 51 and the bottom electrode 55.

Therefore, a predetermined write current Iwr is provided to each memory cell in the memory cell array 500 so as to change the state of the phase change element contained in the memory cell, such that a current value is detected in response to the generated state and data can be read from the detected current value.

For example, if the phase change element 50 has a low resistance value, a set state may be achieved. In order to assign the set state to the phase change element 50, it is necessary to provide and maintain a constant current during a relatively long write time. In accordance with an embodiment of the present invention, the write current Iwr shown in FIGS. 1 to 9 may be provided to assign the set state to the phase change element 50. The write current Iwr for assigning the set state to the phase change element 50 must maintain a constant waveform during a predetermined write time. For this purpose, the write current Iwr has to maintain a predetermined value without being affected by the variation in a threshold voltage of a transistor. The above-mentioned description has been disclosed only for illustrative purposes, and the scope or spirit of the present invention is not limited thereto and can also be applied to other examples.

The semiconductor memory device 10 according to the embodiment of the present invention can provide the write current Iwr having a different value in response to data to be written in the memory cell array 500.

If the phase change element 50 has a high resistance value, a reset state may be achieved. In order to assign the reset state to the phase change element 50, a peak-pulse-shaped current having a high value for a short time must be provided to the phase change element 50.

Therefore, the semiconductor memory device including the current driver according to the embodiments of the present invention can provide the write current that stably maintains a predetermined current value for a predetermined time, such that the semiconductor memory device can be driven with high reliability.

As is apparent from the above description, the semiconductor memory device according to the embodiments of the present invention does not provide a write current on the basis of a control voltage, provides the write current on the basis of a control current stably changing in response to the control voltage, and provides the write current maintaining a desired pulse shape, resulting in improving the reliability of a data write operation.

Those skilled in the art will appreciate that the present invention may be carried out in other specific ways than those set forth herein without departing from the spirit and essential characteristics of the present invention. The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an exemplary embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor memory device comprising:
   a memory cell array including a plurality of memory cells; and
   a current driver configured to provide a write current to the memory cell array,
   wherein the current driver comprises:
      a step voltage provider configured to provide a step control voltage whose voltage levels change in response to a pulse control signal;
      a control current provider configured to provide a control current in response to the step control voltage; and
      a write driver configured to provide the write current to write data in the memory cell array in response to the control current.

2. The semiconductor memory device according to claim 1, wherein the control current provider includes a plurality of transistors, and the step control voltage is converted to the control current on the basis of size ratios of the plurality of transistors.

3. The semiconductor memory device according to claim 1, wherein the control current provider includes:
   a unity gain buffer configured to provide a step current by stabilizing the step control voltage; and
   a plurality of transistors configured to provide the control current on the basis of the step current, wherein the control current has a different value depending on size ratios of the plurality of transistors.

4. The semiconductor memory device according to claim 3, wherein the unity gain buffer includes an inverting terminal receiving the step control voltage and a non-inverting terminal coupled to a first node, and
wherein the plurality of transistors includes:
   a first PMOS transistor including a gate terminal coupled to an output terminal of the unity gain buffer, a first terminal coupled to a power-supply voltage, and a second terminal coupled to the first node;
   a second PMOS transistor including a gate terminal coupled to the gate terminal of the first PMOS transistor and a first terminal receiving the power-supply voltage;
   a first NMOS transistor including a gate terminal and a first terminal coupled to a second terminal of the second PMOS transistor and a second terminal coupled to a ground voltage; and
   a second NMOS transistor including a gate terminal coupled to the gate terminal of the first NMOS transistor, a second terminal coupled to the ground voltage, and a first terminal through which the control current is output, wherein the second NMOS transistor is coupled to the first NMOS transistor in the form of a current mirror.

5. The semiconductor memory device according to claim 4, further comprising a resistor coupled between the first node and the ground voltage.

6. The semiconductor memory device according to claim 1, wherein the write driver includes:
   a first PMOS transistor including a second terminal receiving a write step-up voltage and a gate terminal and a first terminal commonly coupled to each other to receive the control current; and
   a second PMOS transistor including a gate terminal coupled to the gate terminal of the first PMOS transistor, a second terminal receiving the write step-up voltage, and a first terminal to provide the write current.

7. The semiconductor memory device according to claim 1, wherein the step voltage provider includes:
- a maximum voltage selector configured to select and output a maximum voltage of the step control voltage on the basis of the pulse control signal;
- a minimum voltage selector configured to select and output a minimum voltage of the step control voltage on the basis of the pulse control signal; and
- a step voltage selector configured to provide the step control voltage whose voltage level sequentially changes between the maximum voltage and the minimum voltage on the basis of the pulse control signal.

8. The semiconductor memory device according to claim 7, wherein the step voltage provider further includes:
- a temperature sensing unit configured to provide a temperature sensing signal by sensing an operation temperature of the semiconductor memory device, voltage levels of the maximum voltage and the minimum voltage varying in response to the temperature sensing signal.

9. The semiconductor memory device according to claim 7, wherein the maximum voltage selector includes a plurality of first resistors coupled in series between a first voltage and a ground voltage and is configured to output the maximum voltage by dividing the first voltage using the first resistors.

10. The semiconductor memory device according to claim 9, wherein the minimum voltage selector includes a plurality of second resistors coupled in series between a second voltage and a ground voltage and is configured to output the minimum voltage by dividing the second voltage using the second resistors.

11. The semiconductor memory device according to claim 10, wherein the step voltage selector includes a plurality of third resistors coupled in series between the maximum voltage and the minimum voltage and is configured to output the step control voltage whose voltage level sequentially changes in a range of the maximum voltage to the minimum voltage.

12. The semiconductor memory device according to claim 11, further comprising a temperature sensing unit configured to control the first and second voltages by sensing an operation temperature of the semiconductor memory device.

13. The semiconductor memory device according to claim 7,
- wherein the pulse control signal includes a maximum voltage control signal, a minimum voltage control signal, and a step voltage control signal, and
- wherein the maximum voltage selector, the minimum voltage selector, and the step voltage selector are controlled by the maximum voltage control signal, the minimum voltage control signal, and the step voltage control signal, respectively.

14. The semiconductor memory device according to claim 13, wherein each of the maximum voltage control signal, the minimum voltage control signal, and the step voltage control signal is a digital signal including a plurality of bits.

15. The semiconductor memory device according to claim 14,
- wherein one of the bits of the maximum voltage control signal is activated to select and output one of voltage levels generated by the maximum voltage selector as the maximum voltage,
- wherein one of the bits of the minimum voltage control signal is activated to select and output one of voltage levels generated by the minimum voltage selector as the minimum voltage, and
- wherein the bits of the step voltage control signal are sequentially activated to output the step control voltage.

16. The semiconductor memory device according to claim 1, wherein the memory cell array includes a plurality of phase change memory cells having different resistance values depending on the write current.

17. The semiconductor memory device according to claim 16, further comprising:
- a controller configured to provide an address signal to the memory cell array and provide the pulse control signal.

* * * * *